United States Patent [19]

Hashimoto

[11] Patent Number: 5,442,470
[45] Date of Patent: Aug. 15, 1995

[54] LIQUID CRYSTAL DEVICE HAVING FRAME MEMBER AND ELECTRONIC APPARATUS USING THE SAME

[75] Inventor: Hiroyuki Hashimoto, Suwa, Japan

[73] Assignee: Seiko Epson Corporation, Tokyo, Japan

[21] Appl. No.: 136,986

[22] Filed: Oct. 18, 1993

Related U.S. Application Data

[63] Continuation of Ser. No. 31,853, Mar. 16, 1993, abandoned.

[30] Foreign Application Priority Data

Mar. 26, 1992 [JP] Japan ................... 4-068336
Dec. 8, 1992 [JP] Japan ................... 4-328162

[51] Int. Cl.⁶ .......................................... G02F 1/1333
[52] U.S. Cl. ............................ 359/83; 359/42; 359/88
[58] Field of Search ................ 359/83, 88, 42, 50

[56] References Cited

U.S. PATENT DOCUMENTS

| | | | |
|---|---|---|---|
| 4,431,270 | 2/1984 | Funada et al. | 359/88 |
| 4,727,285 | 2/1988 | Taniguchi | 359/83 |
| 4,862,153 | 8/1989 | Nakatani et al. | 359/83 |
| 5,161,009 | 11/1992 | Tanoi et al. | 359/82 |
| 5,182,660 | 1/1993 | Tanaka | 359/50 |

FOREIGN PATENT DOCUMENTS

| | | | |
|---|---|---|---|
| 62-159120 | 7/1987 | Japan | 359/88 |
| 64-88928 | 4/1989 | Japan . | |
| 1-142534 | 6/1989 | Japan . | |
| 2-210487 | 8/1990 | Japan | 359/88 |
| 0121417 | 5/1991 | Japan | 359/83 |
| 404083230 | 3/1992 | Japan | 359/83 |
| 404177222 | 6/1992 | Japan | 359/83 |
| 4-256927 | 9/1992 | Japan . | |

Primary Examiner—William L. Sikes
Assistant Examiner—Huy Mai
Attorney, Agent, or Firm—Oliff & Berridge

[57] ABSTRACT

A liquid crystal display device has a liquid crystal panel, a circuit board carrying electric circuits for driving the liquid crystal panel, a flexible printed circuit electrically connected between the liquid crystal panel and the circuit board, and a frame member having a substantially U-shaped cross-sectional shape. The frame member supports the liquid crystal panel and the circuit board in a planar manner with its inner wall surfaces. The flexible printed circuit is disposed inside the frame member without being exposed therefrom.

69 Claims, 5 Drawing Sheets

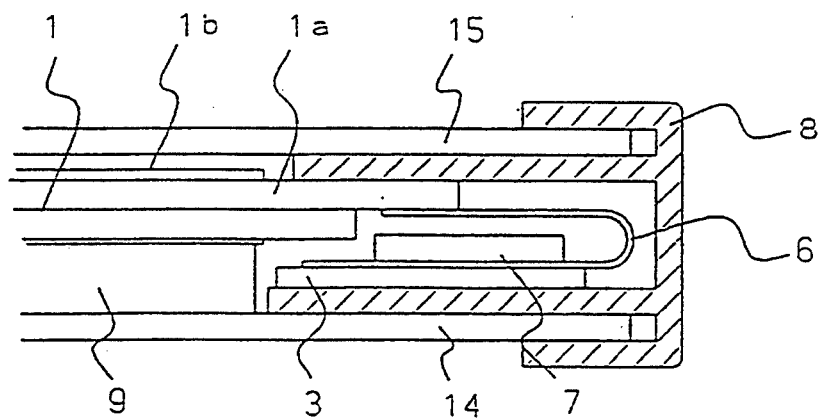
FIG.9
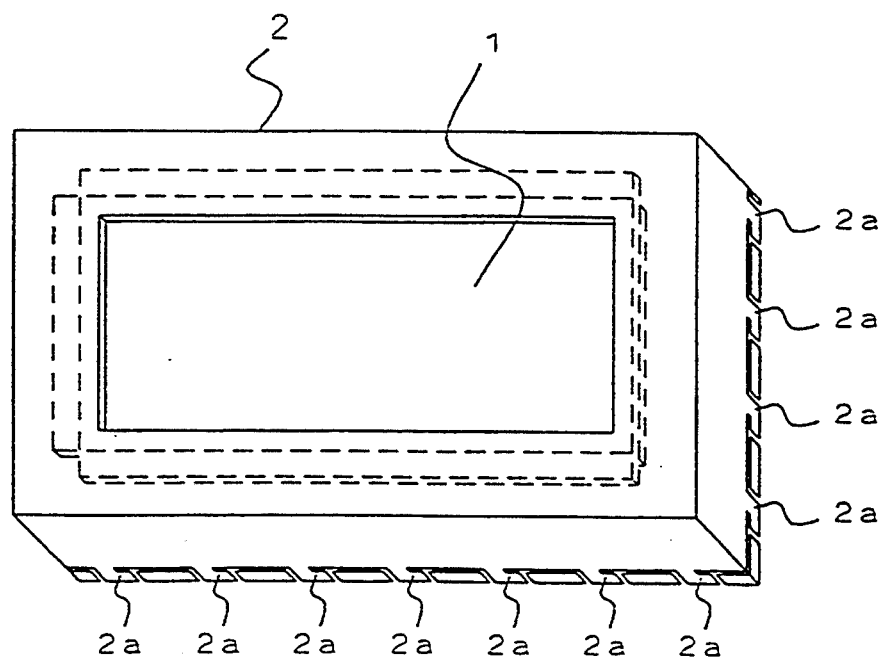
FIG.10 *PRIOR ART*

LIQUID CRYSTAL DEVICE HAVING FRAME MEMBER AND ELECTRONIC APPARATUS USING THE SAME

This is a continuation of application Ser. No. 08/031,853 filed Mar. 16, 1993, now abandoned.

BACKGROUND OF THE INVENTION

1. Field of the Invention

The present invention relates to a liquid crystal display device, and more particularly, to a liquid crystal display device in which a liquid crystal panel and a circuit board for driving the liquid crystal panel are electrically connected through a flexible printed circuit.

2. Description of Related Art

A liquid crystal display device is known in which a liquid crystal panel and a PCB (Printed Circuit Board) for driving the panel are electrically connected to each other through a flexible connector such as an FPC (Flexible Printed Circuit). In recent years, it has become common to use an arrangement known as COF (Chip on Film) in which an integrated circuit such as a liquid crystal driving LSI (Large Scale Integrated Circuit) chip is mounted on a flexible printed circuit as disclosed, for example, in Japanese ]Utility Model Laid-Open No. 1-88928.

FIG. 10 is a perspective view of an example of a known liquid crystal display device which uses COF technology. Referring to FIG. 10, the liquid crystal display device has a liquid crystal panel 1 held by a flat rectangular framework 2 made of a material such as aluminum or a cold-rolled steel sheet. The framework 2 is fixed at a plurality of portions thereof to a case (not shown) made of plastic, by being secured to the case with securement tabs 2a (which are inserted into slots in the case, and then bent from behind) or by means of screws so that the framework presses against the peripheries of at least two sides of the liquid crystal panel (for example, the left and right sides or the top and bottom sides of panel 1 as shown in FIG. 10). The liquid crystal panel 1 and the framework 2 are integrally held together with the case (not shown) by the above-mentioned pressing force, thus forming the liquid crystal display device.

In the construction described above, it is necessary to distribute as many attachment points (i.e., using tabs 2a or screws) as possible as uniformly as possible on framework 2 as shown in FIG. 10 in order to avoid breakage of the liquid crystal panel 1 which may otherwise be caused by local concentration of stress on the liquid crystal panel 1. Consequently, the degree of freedom of the structural design is undesirably limited and the number of steps in the assembly process is increased, thus lowering the production efficiency.

In general, a liquid crystal display device undergoes assembly and disassembly a plurality of times for the purpose of maintenance and periodic inspection during its lifetime. Therefore, when securement of the liquid crystal panel relies upon securement tabs 2a, it is necessary that the material of the framework 2 is capable of enduring several cycles of flexing (i.e., due to bending and straightening of tabs 2a). To meet this requirement, the framework 2 is made of, for example, a cold-rolled steel sheet having a thickness of 0.6 mm or greater. When screws are used as a means for securing the liquid crystal panel, the material of the framework 2 must be capable of sustaining the tightening torque exerted on the fixing screws. However, the number of possible positions where the screw holes can be formed are limited. Therefore, in order that the liquid crystal panel is pressed uniformly, securement tabs 2a are usually required in addition to screws because fixing by screws alone cannot provide sufficient fixing effect. This essentially requires that a metal is used as the material of framework 2.

In order to simultaneously press at least two sides of the liquid crystal panel 1, the framework 2 essentially has a planar rectangular form with outside dimensions sufficiently greater than those of the liquid crystal panel 1, as can be seen from FIG. 10. Consequently, the size and weight of the framework 2 are large, with the result that the overall weight of the entire liquid crystal display device is increased.

When a metal is used as the material of the framework 2 for the reasons stated above, it is necessary to provide a suitable electrical insulation member for electrically isolating the metallic framework 2 from a circuit board (not shown) or from a flexible printed circuit (not shown) which is usually disposed in close proximity of the framework 2. Provision of such an electrical insulation member undesirably increases the number of steps in the assembly process and increases the outside dimensions of the framework 2 by an amount corresponding to the space required for accommodating the electrical insulation member, with a consequence that the overall size of the liquid crystal display device is increased even further.

SUMMARY OF THE INVENTION

It is an object of the present invention to provide a highly reliable liquid crystal display device which has a compact construction with a reduced size and weight and which can be produced at a high production efficiency.

It is another object of the present invention to provide an electronic apparatus including the above liquid crystal display device and, hence, having a reduced size and weight.

To these ends, and in order to achieve the above and other objects, according to one aspect of the present invention there is provided a liquid crystal display device, comprising a liquid crystal panel, a circuit board carrying electric circuits for driving the liquid crystal panel, a flexible printed circuit electrically connected between the liquid crystal panel and the circuit board, and a frame member having a substantially U-shaped cross-sectional shape and which supports the liquid crystal panel and the circuit board in a planar manner, with the flexible printed circuit being disposed inside the frame member so as to protect the flexible printed circuit.

In a liquid crystal display device having the construction described above, independent frame members may be disposed on different peripheral sides of the liquid crystal panel.

According to another aspect of the invention, there is provided an electronic apparatus incorporating the liquid crystal display device set forth above.

In the liquid crystal display device of the present invention, the liquid crystal panel and the circuit board preferably are held in a planar manner between the opposing inner surfaces of the frame member having a U-shaped cross-section. Therefore, stresses are uniformly distributed without local concentration which otherwise may occur when conventional fixing means such as securement tabs or screws are used. It is thus possible to obtain a liquid crystal display device greatly improved both in resistance to vibration and to impact.

Furthermore, since the flexible printed circuit is disposed inside the frame member so that the flexible printed circuit is not exposed to the exterior of the frame member, the risk of damaging the flexible printed circuit is minimized during handling of the liquid crystal display device when the latter is mounted in an apparatus. In addition, damaging and shorting of the circuit due to electrostatic charges and foreign materials (e.g., dust, dirt, objects, etc.) are effectively prevented.

According to the invention, it is possible to use independent frame members for different sides of the liquid crystal panel. In addition, frame members of the same size and construction can be used for holding opposite sides of the liquid crystal panel. Consequently, the size of the frame module is reduced as compared with the conventional framework which is designed and constructed so as to simultaneously press at least two sides of the liquid crystal display panel. Consequently, handling of the frame is facilitated and the overall weight of the apparatus is reduced.

Furthermore, an electronic apparatus on which the liquid crystal display device of the invention is mounted can have a reduced weight and size.

BRIEF DESCRIPTION OF THE DRAWINGS

The invention will be described in detail with reference to the following drawings in which like reference numerals refer to like elements and wherein:

FIG. 9 is an enlarged sectional view of a liquid crystal display device in accordance with a further embodiment of the present invention; and FIG. 10 is a perspective view of an example of a known liquid crystal display device.

DETAILED DESCRIPTION OF PREFERRED EMBODIMENTS

The invention will be described in detail with reference to the drawings which show preferred embodiments of the invention.

Figure 1:
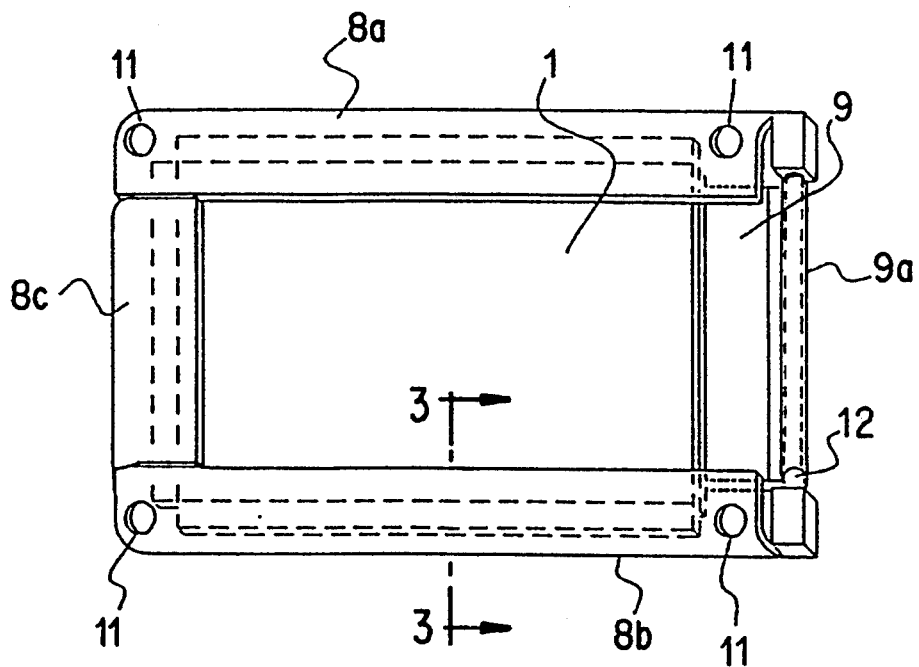
FIG. 1 is a perspective view of a liquid crystal display device in accordance with a first embodiment of the present invention.
Figure 2:
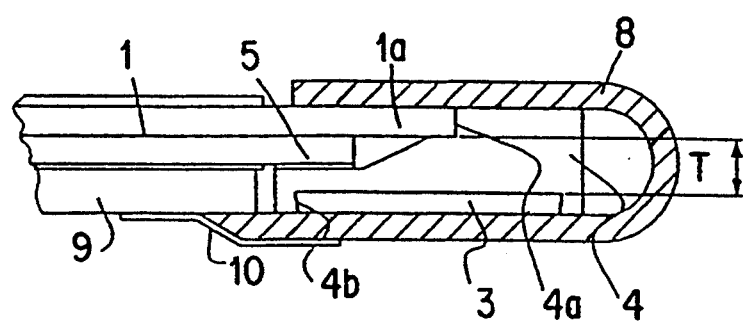
FIG. 2 is a sectional view of the liquid crystal display device of FIG. 1, illustrating the manner in which the components of the device are secured together.
Figure 3:
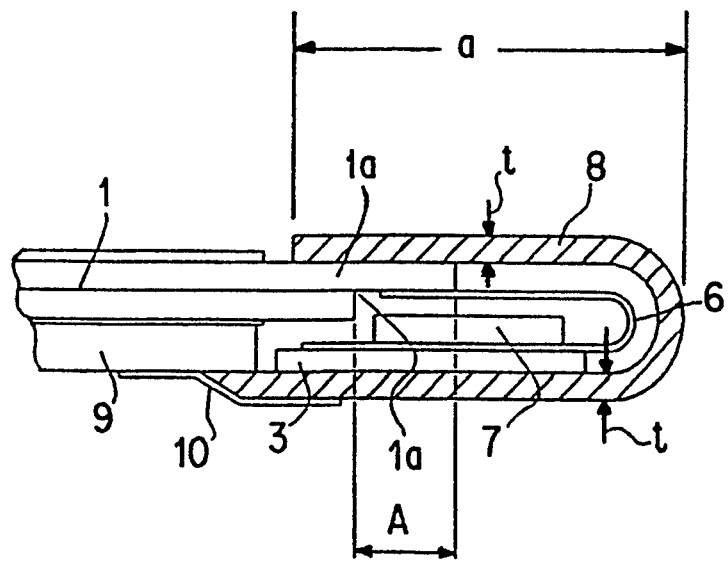
FIG. 3 is an enlarged sectional view taken along the line 3—3 of FIG. 1.

FIG. 1 is a perspective view of an embodiment of a liquid crystal display device of the present invention. FIG. 2 is a sectional view of the liquid crystal display device shown in FIG. 1, illustrating the manner in which components are secured. FIG. 3 is an enlarged sectional view taken along the line 3—3 of FIG. 1.

This first embodiment is a liquid crystal display device suitable for use in, e.g., a notebook type personal computer, and more particularly uses a white/black monochromatic passive matrix LCD having a pixel pitch of 0.3 mm. The panel of the liquid crystal display device includes a dot matrix containing 640 dots in the horizontal direction and 480 dots in the vertical direction, and is split into upper and lower halves which are independently driven at a duty ratio of 1/240.

In this embodiment, the liquid crystal panel 1 and a circuit board 3 (see FIG. 2) for driving and controlling the liquid crystal panel 1 are disposed substantially in parallel with each other with a predetermined spacing therebetween. The circuit board 3 is disposed radially outside of the display area of the liquid crystal panel 1 so as not to interfere with the display on the liquid crystal panel 1. Circuit board 3 can be formed, for example, on a composite member (e.g., CEM 3) having a thickness of about 0.8 mm and a width of about 10.5 mm.

A holder member 4 for holding the circuit board 3 at a predetermined position is attached to the reverse side of the liquid crystal panel 1 by a suitable fixing means such as, for example, an adhesive tape 5, with an edge of the liquid crystal panel 1 fitting on a step 4a of the holder member 4. The holder member 4 has, for example, a length of 12.2 mm, a width of 4.8 mm, and a thickness of 4.0 mm, and is made of, for example, an ABS (acrylonitrile-butadiene-styrene copolymer) resin. In the FIG. 1 example, three holder members 4 were arranged along each longer side of the liquid crystal panel 1, each holder member being located between a pair of adjacent flexible printed circuits (to be described below). That is, a circuit board 3 was provided for each of the two longer sides of panel 1. Each circuit board 3 extended for a substantial distance along its corresponding side of panel 1, and was secured to panel 1 by three holder members 4. Each circuit board 3 was electrically coupled to panel 1 by a plurality of flexible printed circuits located adjacent to the holder members 4.

The holder member 4 and the circuit board 3 are integrally dovetail-connected, with, for example, an end of the circuit board 3 press-fitting in a dovetail groove 4b formed in the holder member 4. The attachment of the holder member 4 and the circuit board 3 may be done by means other than the described dovetail connection, e.g., by means of a double-sided adhesive tape or an adhesive.

In the described embodiment, the distance T between the surface of glass 1a of the liquid crystal panel 1 containing terminals and the circuit board 3 is determined to be 2.6 mm. However, if circumstances do not permit such a space to be provided between the liquid crystal panel 1 and the circuit board 3, the circuit board 3 may be fixed directly to the reverse side of the liquid crystal panel 1 by a suitable fixing means such as an adhesive. Thus, holder member 4 is not necessarily required.

As shown in FIG. 3, a flexible printed circuit 6 is bent in a substantially U-like form, with one end thereof electrically connected to the terminals on glass 1a of the liquid crystal panel 1, while the other end of flexible printed circuit 6 is electrically connected to the circuit board 3.

An integrated circuit 7 for driving the liquid crystal, e.g., an LSI chip, is mounted on the flexible printed circuit 6. The integrated circuit 7 is at least partially accommodated in a space which is provided by a stepped portion A.

The liquid crystal panel 1 and the circuit board 3 are supported in a planar manner between the inner opposed surfaces of a frame member 8, thus forming an integral liquid crystal display device. As illustrated, the flexible printed circuit 6 is completely received in the space inside the frame member 8 so that it is hidden from view and cannot be touched from the outside after assembly of the liquid crystal display device. It is therefore possible to eliminate problems such as breakage of the flexible printed circuit 6 due to handling during mounting of the liquid crystal display device in an apparatus, as well as damaging and shorting of the circuits which may otherwise occur due to electrostatic charges or foreign matter contacting flexible printed circuit 6.

Figure 4:
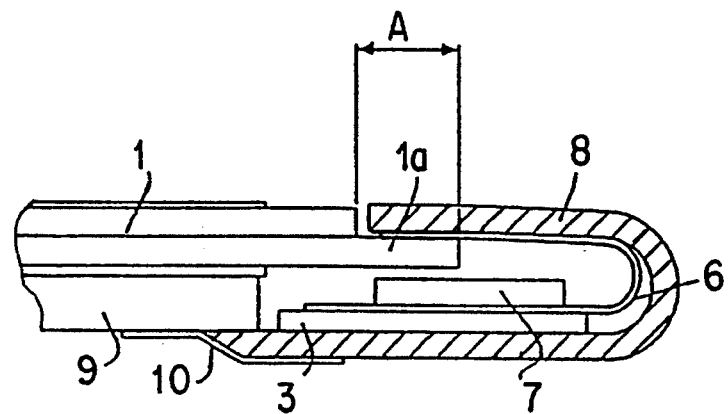
FIG. 4 is an enlarged sectional view of another embodiment of a liquid crystal display device taken along a plane corresponding to the plane of the line 3—3 of FIG. 1.

In FIG. 3, the frame member 8 contacts and presses the surface of the glass 1a of the liquid crystal panel 1 opposite from the surface of glass 1a containing terminals. This, however, is only illustrative and the arrangement may be modified such that the frame member 8 presses the terminal-containing surface of the glass 1a of the liquid crystal display device 1, as shown in FIG. 4. According to such a modification, the frame member 8 engages the stepped portion A so that the thickness of the liquid crystal display device is reduced as compared with the arrangement shown in FIG. 3. In addition, a higher reliability of electrical connection between the flexible printed circuit 6 and the terminals on glass 1a is obtained because the electrical connection portion between them is pressed by the frame member 8.

According to this embodiment, the liquid crystal panel 1 is illuminated from the rear side thereof. To this end, a light conductive plate 9 of PMMA (poly-methylmethacrylate) having a thickness of 2.0 mm is disposed on the rear side of the liquid crystal panel 1. The light conductive plate 9 is supported in a planar manner by frame member 8 and is integrated therewith by means of, for example, tape 10.

The frame member 8 can be formed by, for example, an extrusion process so as to have a U-shaped cross-section, with a sheet thickness of, for example, 0.8 mm, a depth of 20.2 mm and a width of 6.4 mm.

The extrusion process is advantageously employed because this method makes it possible to continuously form a length of frame member 8, regardless of the dimensions of the display devices with which frame member 8 will be used, with a single die and to minimize the thickness of the walls of the frame member 8. Consequently, the production efficiency is remarkably improved as compared with the known art which employs a planar rectangular framework 2 fabricated from a metallic material. At the same time, the weight of the resulting structure can be reduced by about ⅓ compared to the framework 2 arrangement.

The frame member 8 preferably has a moderate level of resiliency for nipping the liquid crystal display panel 1 and the circuit board 3. The nipping by the resiliency of the frame member 8 offers an advantage over the previous use of tabs or screws because the force applied to the liquid crystal panel 1 and to the circuit board 3 is uniformly distributed over the entire length of contact with frame member 8, without any local concentration. Consequently, the liquid crystal device of this embodiment exhibits greater durability and resistance to vibration and impacts.

The material of the frame member 8 should be selected so as to avoid any creep deformation of the frame member 8 which otherwise might occur due to the heat generated by the back light system or when the device is used in a hot humid atmosphere. The selection of a material for frame member 8 may be conducted on the basis of the following formula.

If (a) represents the distance between an edge of the U-shaped frame member and the load point on the inner surface of the frame member 8, and (t) represents the thickness of the frame member 8 (see FIG. 3) the relationship between the load (W) applied perpendicularly to the walls of the frame member per unit length (the units of (W) are Kg/cm) and the practically allowable creep stress S is expressed by the following equation:

$$W = St^2/6a.$$

In this embodiment, the weight of the assembly inclusive of the liquid crystal panel 1 and the back light system is about 370 g and the above-mentioned distance (a) is about 10 mm. Therefore, if the above-mentioned weight is to be borne by a pair of frame members 8, each having a length of 21 cm, engaging with both longitudinal sides of the liquid crystal panel 1, the practically allowable stress S can be calculated to be about 8.3 Kg/cm$^2$.

The practically allowable creep stress is estimated to be about 15 Kg/cm$^2$ even in the case of PVC (polyvinyl chloride) or PS (polystyrene) which are ordinarily used as materials for extrusion, provided that these materials are shaped according to the equation stated above. Thus, these materials can satisfactorily be used for liquid crystal display devices of sizes equivalent to those of the described embodiment.

However, PVC or PS will have only a small margin against thermal creeping when used in a color display device which employs a heavier back light system or in a liquid crystal display device having a large display area with a high level of definition.

It is also to be noted that PVC undesirably exhibits a large change in the Izod strength (a measure of impact resistance according to Japanese Industry Standard K7100) e.g., down to 1/10, after a 100-hour use at high temperature. This problem would be overcome by using a PVC-based polymer alloy but the selection of such material is limited at the present time due to various requirements such as incombustibility.

In this embodiment, therefore, NORYL SE-90, which is a PPO (polyphenylene oxide) resin produced by GE plastics and which is a 94-VO material (i.e., a high grade fire resistant material) excellent in resistance to heat and impact, can be suitably used as the material of the frame member 8. This material exhibits a practically allowable creep stress of about 55 Kg/cm$^2$ under the abovedescribed conditions, as well as constant Izod strength of about 20 Kg-cm/cm for a long time at 60° C. Thus, the above-mentioned material meets the requirements for use in the present invention.

An experiment was conducted to determine the wall thickness of a frame member 8 made of NORYL SE-90 necessary for obtaining a liquid crystal display device having a strength equivalent to that of conventional devices. As a result of this experiment, it was confirmed that the frame member 8 of NORYL SE-90 possesses sufficient strength when its thickness is about 0.6 mm which is substantially the same as that of the conventionally used metallic framework. This means that the overall thickness of the liquid crystal display device can be reduced by an amount corresponding to the thickness of the internal electrical insulation which is required in the conventional liquid crystal display devices of the kind described above, since no internal electrical insulation is required with the present invention.

A test manufacture of this embodiment demonstrated that about a 23.5% reduction in the overall thickness of the liquid crystal display is achievable, from a thickness of 8.5 mm for the conventional devices down to 6.5 mm. The weight also was reduced by about 20.4%, from a weight of 490 g for the conventional devices down to 390 g.

The use of extrusion as the method for forming the frame member 8 is not essential. For example, the frame member 8 may be formed by injection molding. By using injection molding, it is possible to form a frame member having an irregular form, e.g., a member with a varying cross-sectional shape, which cannot be obtained through extrusion. Additionally, when the frame member is required to have an extremely small thickness that cannot be obtained through injection forming, various sheet working techniques for bending thin sheets, including vacuum forming techniques can be employed.

In this embodiment, frame members 8a, 8b and 8c are disposed on three sides of the liquid crystal panel, as shown in FIG. 1. If the arrangement of the components of the liquid crystal display device is such that the frame members 8a and 8b on two opposite sides of the liquid crystal panel 1 are disposed symmetrically with each other, frame members 8a and 8b can have an identical configuration. Namely, frame members having the same size and geometry can be used both as the frame member 8a and the frame member 8b, so that the efficiency of mass production of the liquid crystal display device is improved advantageously. Holes 11 are provided in both ends of each of the frame members 8a and 8b. Thus, there are four such holes 11. These holes 11 can be used as mounting holes for mounting the entire liquid crystal display device on an apparatus and, at the same time, can be used as locating holes which provide position references for correctly locating the frame members 8a and 8b during attachment to panel 1.

A fluorescent tube 12 which serves as a light source for the light conducting plate 9 is disposed on the right side of the frame members 8a, 8b as viewed in FIG. 1, and is fixed to the light conducting plate 9 by means of a reflective film 9a. It is therefore possible to replace or repair the fluorescent tube 12 without requiring demounting of the frame members 8a and 8b.

Another embodiment of the present invention will now be described.

Figure 5:
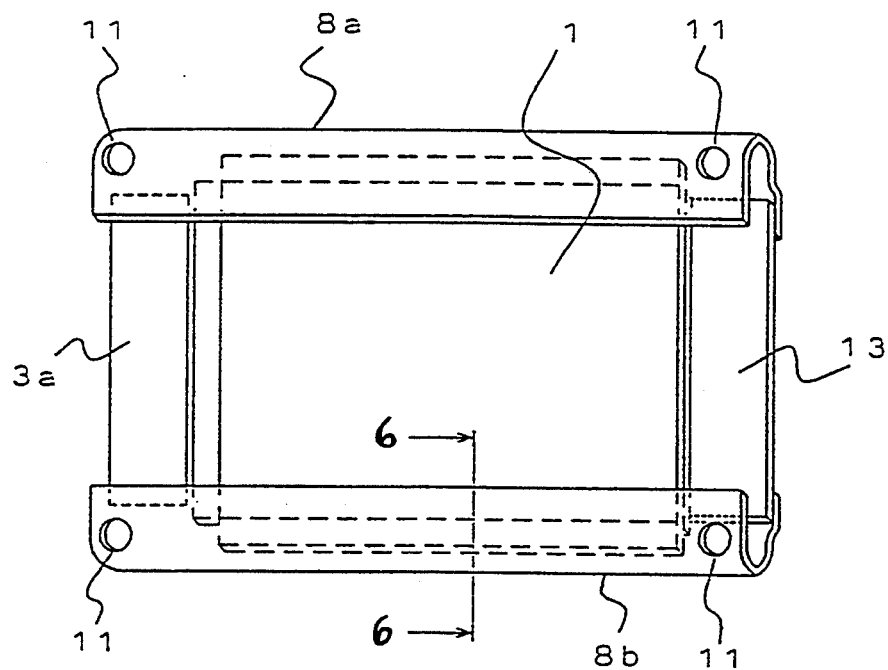
FIG. 5 is a perspective view of a liquid crystal display device in accordance with another embodiment of the present invention.
Figure 6:
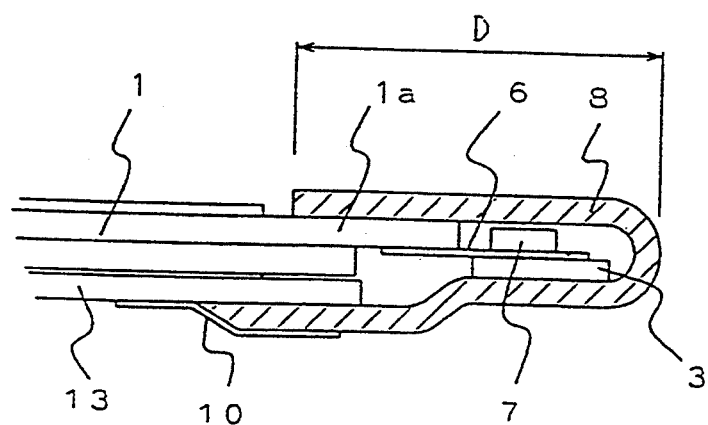
FIG. 6 is an enlarged sectional view taken along the line 6—6 of FIG. 5.

FIG. 5 is a front elevational view of a liquid crystal display device embodying the present invention, while FIG. 6 is an enlarged sectional view taken along the line 6—6 of FIG. 5. In this embodiment, the liquid crystal panel 1 and the circuit board 3 are held substantially in a common plane, as shown in FIG. 6.

As in the first embodiment described hereinabove, a flexible printed circuit 6 is electrically connected at one end to the glass 1a of a liquid crystal panel 1 adjacent to its terminals, while the second end of flexible printed circuit 6 is electrically connected to a circuit board 3. An integrated circuit 7 such as an LSI chip for driving the liquid crystal is mounted on flexible printed circuit 6. In this embodiment, however, the integrated circuit 7 has a rod-like form having a short-to-long side length ratio of about 1:10, in order to reduce the dead area D. Consequently, the width of the circuit board 3 can also be reduced, e.g., to about 4.0 mm. In spite of the reduced width of circuit board 3, it is possible, if necessary, to maintain the same number of wiring patterns on circuit board 3, either by increasing the wiring pattern density, or by using a multilayered board having via holes for interconnecting wiring patterns on the multiple layers. For example, a BVH (Blind Via Hole) substrate produced by Sharp Electronic Parts Manufacturing Co., Ltd. could be used as circuit board 3.

The liquid crystal panel 1 of this embodiment operates in reflection mode and, therefore, does not have any back light system. In addition, there is no member (i.e., holder member 4) for integrally fixing the circuit board 3 to the liquid crystal panel 1. Thus, the circuit board 3 is fixed merely by being supported by the inner surface of the frame member 8, as shown in FIG. 6. An experiment showed that practical satisfactory strength can be obtained in this embodiment.

As in the first embodiment, the frame member 8 is formed by extrusion so as to exhibit resiliency, to nip the liquid crystal panel 1 and the circuit board 3 and a spacer 13 by pressing the upper surface of the liquid crystal panel 1 and the lower surfaces of the circuit board 3 and the spacer 13. In order to prevent any unevenness of the display color which tends to be caused by a change in the cell thickness when the liquid crystal panel 1 is directly pressed at its rear side, the stress generated by the resilient nipping force exerted by the frame member 8 is uniformly distributed by the spacer over a large area. The spacer 13 is integrated with the frame member 8 by means of tape 10.

In this embodiment, as shown in FIG. 5, only two longer sides of the apparatus are retained by a pair of frame members 8a and 8b. Thus, there is no frame member on the left side of the device as viewed in FIG. 5, and a circuit board 3a is exposed at the left side of the device. An experiment showed, however, that the liquid crystal display device of this embodiment can be secured on an apparatus with a sufficiently high level of strength by using the mounting holes 11, even through the liquid crystal panel is supported only at its two longer sides. Thus, the second embodiment shown in FIGS. 5 and 6, which lacks frame members on the shorter sides of the liquid crystal panel, is suitably employed in situations where a priority is given to the reduction in the weight and size of the apparatus rather than to the protection of the flexible printed circuit and circuit board.

Figure 7:
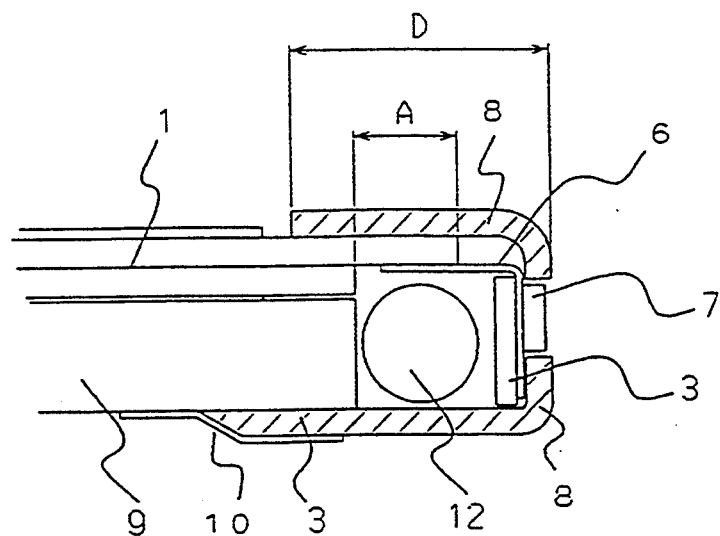
FIG. 7 is an enlarged sectional view of a liquid crystal display device in accordance with a further embodiment of the present invention.

FIG. 7 is an enlarged sectional view of still another embodiment of the present invention. In this embodiment, a fluorescent tube 12 of 3.15 mm diameter, serving as a light source for a light conducting plate 9, is accommodated in a space under a stepped portion A of a liquid crystal panel 1. If the frame member 8 was made of a metal as in the conventional display devices, the luminance of the fluorescent tube would be reduced due to capacitive coupling with the frame member. In the present invention, however, such a problem is not caused because the frame member 8 is made of plastic.

The frame member 8 made of plastic exhibits thermal conductivity of about 2 W/mK, which is about one third of the value (6.1 W/mK) exhibited by the conventionally used metallic material. Consequently, transfer of heat from the fluorescent tube 12 to the liquid crystal panel 1 is reduced so that generation of unevenness of display color, attributable to temperature gradient, is suppressed advantageously.

In this embodiment, the circuit board 3 is disposed substantially perpendicularly to the plane of the liquid crystal panel 1, as will be seen from FIG. 7. The frame member 8 has an opening at a portion thereof where an integrated circuit 7 is provided. Due to this construction, the size D of the dead area is reduced as compared with that in conventional devices, despite the provision of the fluorescent tube 12 inside the frame member.

According to this embodiment, it is also possible to dispose a fluorescent lamp 12 along the longer side of the liquid crystal panel where the flexible printed circuit is provided, without requiring substantial increase in the size of the dead area. This enables the luminance provided by the back light to be increased remarkably. Thus, the embodiment shown in FIG. 7 can suitably be used in liquid crystal display devices that require back light having a high luminance.

Figure 8:
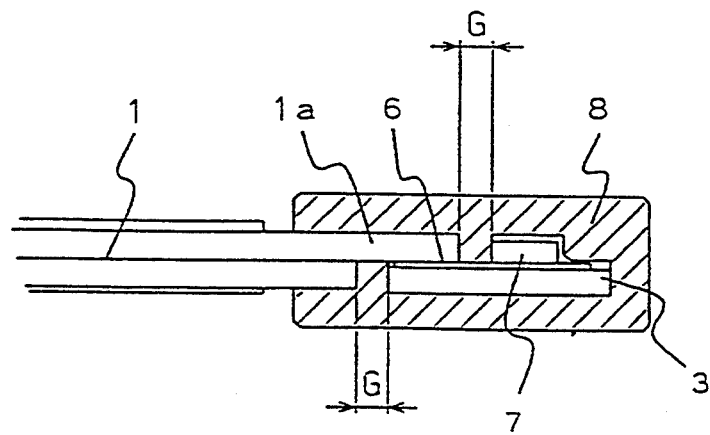
FIG. 8 is an enlarged sectional view of a liquid crystal display device in accordance with still another embodiment of the present invention.

FIG. 8 is an enlarged view of a further embodiment of the present invention. In this embodiment, the frame member 8 is made of a urethane elastomer, e.g., a highly elastic rubbery material such as SORBOTHANE which is a polyurethane elastomer produced by British Tire and Rubber Co., Ltd. The frame member 8 has a fixing protrusion G formed on the inner surface of at least one of the walls thereof. The protrusion G is fitted inside a groove which is formed in the liquid crystal panel 1 along the peripheral sides thereof, thus integrating the frame member 8 with the liquid crystal panel 1. The frame member 8 is highly flexible and does not produce any substantial nipping force. Therefore, no unevenness of display color attributable to non-uniform stress distribution is caused, despite the absence of any member for evenly distributing the stress.

In this embodiment, the liquid crystal panel 1 is supported both at its obverse and reverse sides by the frame member 8 which is highly elastic. Therefore, resistance to vibration, as well as resistances both to mechanical and thermal stresses, are remarkably improved as compared with known liquid crystal display devices. Furthermore, this embodiment exhibits high stability against continuous use at high temperatures, partly because the frame member 8 absorbs static stress which is generated as a result of thermal expansion of the outer case of an electronic apparatus (not shown) and partly because the electrical connection between the flexible printed circuit 6 and the glass 1a adjacent to the terminal is thermally insulated. Consequently, a remarkable improvement is achieved in the reliability over known liquid crystal display devices.

In addition to high reliability, the liquid crystal display device of this embodiment offers an advantage in that it is suitably used for complete transmission mode displays because no supporting part is employed on the reverse side of the liquid crystal panel 1. Thus, the liquid crystal display device of this embodiment can suitably be used as a projection type display device.

FIG. 9 is an enlarged sectional view of a further embodiment of the present invention. In this embodiment, a tablet board 14 for input of coordinate information by an electromagnetic induction stylus is integrated with a protective glass 15 by means of the frame member 8. The tablet board 14 is a printed circuit board carrying a circuit which detects coordinate information entered by the electromagnetic induction stylus, while the protective glass 15 is intended for protecting the liquid crystal panel 1 from being damaged by mechanical force applied by the stylus and for preventing any local unevenness in the thickness of the liquid crystal panel 1.

As will be seen from FIG. 9, the frame member 8 has a cross-sectional shape which can be formed by extrusion. It is not necessary to employ specific additional parts for supporting the tablet board 14 and the protective glass 15. Furthermore, the frame member 8 which is formed from plastic does not produce any undesirable effect on the electromagnetic detection of the coordinate information, which effect is inevitably caused in the known devices of the kind described earlier due to the use of metallic framework 2.

In the illustrated embodiment, an upper polarizing plate 1b is bonded to the glass 1a of the liquid crystal panel 1. This, however, is only illustrative and the upper polarizing plate 1b may be adhered to the inner side of the protective glass 15. Such an arrangement is advantageous because it eliminates the necessity of the troublesome work of bonding the upper polarizing plate 1b to the liquid crystal panel 1 which is not easy to fabricate. In addition, the upper polarizing plate 1b can be replaced easily together with the protective glass 15 with which the polarizing plate is integrated. Therefore, the embodiment shown in FIG. 9 offers a further advantage in that it can easily meet with any demand for a change in the display mode, i.e., between positive and negative modes, change in the polarization axis, and so forth, even after the assembly of the liquid crystal display device.

Any of the liquid crystal display devices of the embodiments described hereinbefore can be incorporated in various electronic apparatus or devices such as, e.g., a personal computer, a wordprocessor, an electronic notebook, and so forth, offering the advantage of reduction in the size and weight of such electronic apparatus or devices.

As will be understood from the foregoing description, according to the present invention, the liquid crystal panel and the circuit board 3 are supported in a planar manner by the inner surfaces of the frame member 8 which preferably has a substantially U-shaped cross-section. Consequently, local concentration of stress which is necessary for the assembly of the liquid crystal panel 1 and the circuit board 3 is avoided, thus attaining remarkable improvement in the resistance both to vibration and impact over known devices in which the liquid crystal panel 1 and the circuit board 3 are fixed by tabs or by means of screws.

Furthermore, the flexible circuit 6 is concealed in the frame member 8 without being exposed therefrom, so that the risk of damage occurring to the flexible printed circuit 6 during handling is avoided when the liquid crystal display device is mounted in a final product. In addition, trouble such as damaging or shorting of the circuits due to electrostatic charges and foreign material is avoided.

It is possible to use independent frame members on different sides of the liquid crystal display device, and frame members of the same size and configuration can be used on two opposite sides of the liquid crystal display device. Consequently, the size of the module of the frame is reduced as compared with the conventionally used framework 2 which is designed and constructed to simultaneously press at least two sides of the liquid crystal panel.

Consequently, handling of the frame is facilitated and the weight of the liquid crystal display device is reduced.

Furthermore, the size and weight of various electronic apparatus employing display devices can be reduced when the liquid crystal display device of the present invention is used therein.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. A liquid crystal display device, comprising:
   a liquid crystal panel;
   a circuit board carrying electric circuits for driving said liquid crystal panel;
   a flexible printed circuit electrically connecting said liquid crystal panel and said circuit board; and
   a frame member having a substantially U-shaped cross-section and contacting said liquid crystal panel and said circuit board, said flexible printed circuit being disposed within an area enclosed by said frame member so that said flexible printed circuit is protected from direct contact by material located outside of said frame member.

2. The liquid crystal display device according to claim 1, wherein said liquid crystal panel includes a matrix of liquid crystal shutter elements therein.

3. The liquid crystal display device according to claim 1, wherein said liquid crystal panel and said circuit board are supported by said frame member so as to be held in a planar manner.

4. The liquid crystal display device according to claim 3, wherein said liquid crystal panel and said circuit board are located in a common plane by said frame member.

5. The liquid crystal display device according to claim 3, wherein said liquid crystal panel and said circuit board are located in perpendicular planes by said frame member.

6. The liquid crystal display device according to claim 1, wherein said liquid crystal panel and said circuit board are contacted and supported by inner walls of said frame member.

7. The liquid crystal display device according to claim 1, further comprising a chip containing an integrated circuit mounted on and electrically coupled to said flexible printed circuit.

8. The liquid crystal display device according to claim 7, wherein said frame member includes an opening through which said chip extends.

9. The liquid crystal display device according to claim 7, wherein said liquid crystal panel includes a plate member attached to said frame member, said plate member extending beyond a liquid-crystal-material-containing portion of said panel to define a stepped portion, at least a portion of said chip located in said stepped portion.

10. The liquid crystal display device according to claim 1, wherein said liquid crystal panel includes a plate member extending beyond a liquid-crystal-material-containing portion of said panel to define a stepped portion, said frame member attached to said plate member within said stepped portion of said panel.

11. The liquid crystal display device according to claim 10, wherein a portion of said flexible printed circuit which is electrically connected to said panel is located between portions of said frame member and said plate member which are attached to each other.

12. The liquid crystal display device according to claim 1, wherein a portion of said flexible printed circuit which is electrically connected to said panel is located between portions of said frame member and said plate member which are attached to each other.

13. The liquid crystal display device according to claim 1, wherein said liquid crystal panel includes a plate member, said frame member and said flexible printed circuit attached to a common side of said plate member.

14. The liquid crystal display device according to claim 1, wherein said liquid crystal panel includes a plate member, said frame member and said flexible printed circuit attached to opposite sides of said plate member.

15. The liquid crystal display device according to claim 1, further comprising a holder attached between said liquid crystal panel and said circuit board for connecting said circuit board to said liquid crystal panel, said holder disposed within said area enclosed by said frame member.

16. The liquid crystal display device according to claim 1, wherein said frame member is resilient.

17. The liquid crystal display device according to claim 1, wherein said frame member is formed from a plastic material.

18. The liquid crystal display device according to claim 17, wherein said plastic material is polyvinyl chloride.

19. The liquid crystal display device according to claim 17, wherein said plastic material is polystyrene.

20. The liquid crystal display device according to claim 17, wherein said plastic material is polyphenylene oxide.

21. The liquid crystal display device according to claim 17, wherein said U-shaped cross-section of said frame member is substantially constant along an entire length of said frame member so that said frame member can be made by an extrusion process.

22. The liquid crystal display device according to claim 17, wherein said U-shaped cross-section of said frame member is non-uniform along a length of said frame member.

23. The liquid crystal display device according to claim 1, wherein said frame member is formed from a flexible material.

24. The liquid crystal display device according to claim 23, wherein said flexible material is an elastomer.

25. The liquid crystal display device according to claim 24, wherein said flexible material is a urethane elastomer.

26. The liquid crystal display device according to claim 1, wherein said frame member includes a main body portion and first and second extension portions extending in a common direction from said main body portion and spaced apart from each other to define said U-shaped cross-section, opposing walls of said first and second extension portions defining inner walls of said frame member, the inner wall of said first extension attached to a first surface of said liquid crystal panel.

27. The liquid crystal display device according to claim 26, wherein the inner wall of said second extension is attached to a second surface of said liquid crystal panel, said second surface facing in an opposite direction from said first surface.

28. The liquid crystal display device according to claim 26, further comprising a planar plate parallel to said liquid crystal panel and having a first surface located adjacent to and opposing said second surface of said liquid crystal panel, the inner wall of said second extension attached to a second surface of said planar plate which faces in an opposite direction from said first surface of said planar plate so that said frame member sandwiches said liquid crystal panel and said planar plate.

29. The liquid crystal display device according to claim 28, wherein said frame member is resilient so as to press said liquid crystal panel and said planar plate against each other.

30. The liquid crystal display device according to claim 29, wherein said planar plate is a spacer element which spreads pressure applied by said frame member evenly over said second surface of said liquid crystal panel.

31. The liquid crystal display device according to claim 28, further comprising a polarizer attached to a surface of said planar plate.

32. The liquid crystal display device according to claim 28, wherein said planar plate is a printed circuit board.

33. The liquid crystal display device according to claim 28, wherein said planar plate is a light conducting plate.

34. The liquid crystal display device according to claim 33, further comprising a light source for supplying light to said light conducting plate.

35. The liquid crystal display device according to claim 34, wherein said light source is located adjacent to an edge of said light conducting plate and between the inner surfaces of said first and second extensions within said area enclosed by said frame member.

36. The liquid crystal display device according to claim 1, wherein said liquid crystal panel has a rectangular shape and further comprising at least two of said frame members, located at least on two opposite sides of said liquid crystal panel.

37. A liquid crystal display device, comprising:
a liquid crystal panel;
a circuit board carrying electric circuits for driving said liquid crystal panel;
a flexible printed circuit electrically connecting said liquid crystal panel and said circuit board; and
a frame member having a substantially U-shaped cross-section and attached to said liquid crystal panel, said circuit board and said flexible printed circuit being disposed within an area enclosed by said frame member so as to be protected from direct contact by material located outside of said frame member.

38. A liquid crystal display device, comprising:
a liquid crystal panel having first and second oppositely facing surfaces and a plurality of sides; and
at least two independent frame members, each frame member having a substantially U-shaped cross-section defined by a main body portion and first and second extension portions extending in a common direction from said main body portion and spaced apart from each other, opposing walls of said first and second extension portions defining inner walls of each frame member, the inner wall of said first extension of each frame member attached to the first surface of said liquid crystal panel along a respective one of said sides of said liquid crystal panel;
at least one of said frame members including a circuit board carrying electric circuits for driving said liquid crystal panel; and a flexible printed circuit electrically connecting said liquid crystal panel and said circuit board; said circuit board and said flexible printed circuit being disposed within an area enclosed by said at least one frame member so as to be protected from direct contact by material located outside of said at least one frame member.

39. The liquid crystal display device according to claim 38, wherein said at least two independent frame members are located at least on two opposite sides of said liquid crystal panel.

40. The liquid crystal display device according to claim 38, wherein all of said at least two frame members includes a corresponding one of said circuit boards and said flexible printed circuits.

41. The liquid crystal display device according to claim 38, wherein said liquid crystal panel has a rectangular shape, said at least two frame members comprises two frame members located on two opposite sides of said rectangular liquid crystal panel, and further comprising a light source attached between ends of said two frame members.

42. The liquid crystal display device according to claim 41, further comprising a light conducting plate parallel to said liquid crystal panel and having a first surface located adjacent to and opposing said second surface of said liquid crystal panel, the inner wall of said second extension of each frame member attached to a second surface of said light conducting plate which faces in an opposite direction from said first surface of said light conducting plate so that said frame members sandwich said liquid crystal panel and said light conducting plate, said light source located adjacent to an edge of said light conducting plate.

43. The liquid crystal display device according to claim 38, further comprising a planar plate parallel to said liquid crystal panel and having a first surface located adjacent to and opposing said second surface of said liquid crystal panel, the inner wall of said second extension of each frame member attached to a second surface of said planar plate which faces in an opposite direction from said first surface of said planar plate so that said frame members sandwich said liquid crystal panel and said planar plate.

44. The liquid crystal display device according to claim 43, wherein said frame members are resilient so as to press said liquid crystal panel and said planar plate against each other.

45. The liquid crystal display device according to claim 44, wherein said planar plate is a spacer element which spreads pressure applied by said frame members evenly over said second surface of said liquid crystal panel.

46. The liquid crystal display device according to claim 44, wherein said frame members are formed from a plastic material.

47. The liquid crystal display device according to claim 46, wherein said plastic material is polyvinyl chloride.

48. The liquid crystal display device according to claim 46, wherein said plastic material is polystyrene.

49. The liquid crystal display device according to claim 46, wherein said plastic material is polyphenylene oxide.

50. The liquid crystal display device according to claim 46, wherein said U-shaped cross-section of said frame members is substantially constant along an entire length of each frame member so that said frame members can be made by an extrusion process.

51. The liquid crystal display device according to claim 46, wherein said U-shaped cross-section of said frame members is non-uniform along a length of each frame member.

52. The liquid crystal display device according to claim 43, further comprising a polarizer attached to a surface of said planar plate.

53. The liquid crystal display device according to claim 43, wherein said planar plate is a light conducting plate.

54. The liquid crystal display device according to claim 38, wherein said frame members are formed from a flexible material.

55. The liquid crystal display device according to claim 54, wherein said flexible material is an elastomer.

56. The liquid crystal display device according to claim 55, wherein said flexible material is a urethane elastomer.

57. The liquid crystal display device according to claim 38, wherein at least some of said frame members include means for mounting said liquid crystal display device to an apparatus which is to incorporate said liquid crystal display device.

58. The liquid crystal display device according to claim 57, wherein said means for mounting includes apertures located in ends of said frame members.

59. A liquid crystal display device, comprising:
a liquid crystal panel having first and second oppositely facing surfaces and first and second oppositely facing sides; and
first and second frame members, separate from each other, each frame member having a substantially U-shaped cross-section defined by a main body portion and first and second extension portions extending in a common direction from said main body portion and spaced apart from each other, opposing walls of said first and second extension portions defining inner walls of each frame member, the inner wall of said first extension of each frame member attached to the first surface of said liquid crystal panel along a corresponding one of said opposite sides of said liquid crystal panel;
at least one of said first and second frame members including a circuit board carrying electric circuits for driving said liquid crystal panel; and a flexible printed circuit electrically connecting said liquid crystal panel and said circuit board; said circuit board and said flexible printed circuit being disposed within an area enclosed by said at least one frame member so as to be protected from direct contact by material located outside of said at least one frame member.

60. The liquid crystal display device according to claim 59, wherein said liquid crystal panel includes a third side extending between said first and second opposite sides, and further comprising a third frame member, separate from said first and second frame members, attached to said third side.

61. The liquid crystal display device according to claim 59, wherein both said first and said second frame members include a corresponding one of said circuit boards and said flexible printed circuits.

62. An electronic apparatus including a liquid crystal display device attached to a portion of said electronic apparatus, said liquid crystal display device comprising:
a liquid crystal panel;
a circuit board carrying electric circuits for driving said liquid crystal panel;
a flexible printed circuit electrically connecting said liquid crystal panel and said circuit board; and
a frame member having a substantially U-shaped cross-section and contacting said liquid crystal panel and said circuit board, said flexible printed circuit being disposed within an area enclosed by said frame member so that said flexible printed circuit is protected from direct contact by material located outside of said frame member.

63. The electronic apparatus of claim 62, wherein said electronic apparatus is a personal computer.

64. The electronic apparatus of claim 63, wherein said personal computer is a notebook-type personal computer.

65. The electronic apparatus of claim 62, wherein said electronic apparatus is a word processor.

66. An electronic apparatus including a liquid crystal display device attached to a portion of said electronic apparatus, said liquid crystal display device comprising:
a liquid crystal panel having first and second oppositely facing surfaces and a plurality of sides; and
at least two independent frame members, each frame member having a substantially U-shaped cross-section defined by a main body portion and first and second extension portions extending in a common direction from said main body portion and spaced apart from each other, opposing walls of said first and second extension portions defining inner walls of each frame member, the inner wall of said first extension of each frame member attached to the first surface of said liquid crystal panel along a respective one of said sides of said liquid crystal panel;
at least one of said frame members including a circuit board carrying electric circuits for driving said liquid crystal panel; and a flexible printed circuit electrically connecting said liquid crystal panel and said circuit board; said circuit board and said flexible printed circuit being disposed within an area enclosed by said at least one frame member so as to be protected from direct contact by material located outside of said at least one frame member.

67. The electronic apparatus of claim 66, wherein said electronic apparatus is a personal computer.

68. The electronic apparatus of claim 67, wherein said personal computer is a notebook-type personal computer.

69. The electronic apparatus of claim 66, wherein said electronic apparatus is a word processor.

* * * * *